United States Patent [19]

Bump

[11] 4,241,306
[45] Dec. 23, 1980

[54] TEST FIXTURE HAVING SWITCHING MEANS FOR FACILITATING TRANSFORMER TURNS RATIO TESTING

[76] Inventor: Russell E. Bump, 3946 E. Meadowbrook, Phoenix, Ariz. 85018

[21] Appl. No.: 937,783

[22] Filed: Aug. 29, 1978

[51] Int. Cl.³ ............................................ G01R 29/20
[52] U.S. Cl. ...................................... 324/55; 307/113
[58] Field of Search .............. 324/55, 158 F; 307/113, 307/112, 115, 149

[56] References Cited

U.S. PATENT DOCUMENTS 3,231,817   1/1966   Bailey ................................ 324/158 F

OTHER PUBLICATIONS

*General Electric Review*, Dec. 1951, p. 27, S. C. Leonard, "Impedance Network for Testing Large Induction Apparatus".

*Primary Examiner*—Richard A. Wintercorn
*Assistant Examiner*—James L. Dwyer
*Attorney, Agent, or Firm*—Harry M. Weiss

[57] ABSTRACT

This disclosure relates to a transformer terminal switching unit or fixture with specially designed output terminals and transformer attachment cables. The disclosed transformer terminal switching unit is especially useful as an accessory to the BIDDLE Transformer Turn Ratio (TTR), tester, catalogue number 55003. The design of the transformer terminal switching test fixture is especially useful to test delta-star connected, three phase utility transformers with subtractively connected winding polarity. A transformer with additive windings can also be tested with the disclosed testing fixture.

4 Claims, 6 Drawing Figures

TEST FIXTURE HAVING SWITCHING MEANS FOR FACILITATING TRANSFORMER TURNS RATIO TESTING

BACKGROUND OF THE INVENTION

1. Field of the Invention

This invention relates generally to Transformer Turns Ratio Testing and more particularly to test fixtures for increasing the speed of Transformer Turns Ratio Testing.

2. Description of the Prior Art

During a useful life of 25 to 40 years a utility network distribution transformer, for example, is subjected to a variety of tests on many occasions starting with acceptance tests upon delivery, to verify name plate and other data. One of the tests of interest to utility companies is determination of the Transformer Turns Ratio (TTR). One type of transformer turns ratiometer uses a standard reference transformer which has accurately calibrated tappings used with a hand cranked exciting magneto, current and voltage meters for normalizing the flux level and a null indicator which indicates the exact transformer turns ratio to 0.1%.

Another method of TTR measurement involves connection of the transformer primary and secondary windings in series with additive polarity. A means is provided for excitation of the windings with a standard current. A potentiometer across the series connected windings with the movable arm connected to the primary and secondary junction through an AC null indicator permits determination of the ratio of primary to secondary turns.

A delta-star connected, three phase utility transformer has three primary terminals and four secondary terminals. Measurement of the ratio of three pairs of primary and secondary windings involves connection of four leads of the ratiometer to each of the six windings in turn and with correct polarity.

The Biddle TT (Transformer Turn) Ratiometer is a four terminal testing device. The four inputs are extended to six feet with flexible instrument leads. Connection to the transformer primary is through a pair of insulated leads terminating in spring loaded clips. Each secondary connection is via an instrument lead which is a dual conductor consisting of a current wire and a potential or voltage wire. The Biddle potential/current leads are connected to the transformer lugs being measured with a specially designed "C" clamp. The stationary end of the "C" clamp is insulated from the clamp body and terminates in an insulated pressure pad which is connected to the potential lead. The frame of the "C" clamp is connected to the secondary current lead. The potential and current leads are connected to the Biddle Ratiometer, thus the connections to each transformer secondary lug is made at a point on each side of the terminal lug which may be anywhere from $\frac{1}{4}"\times\frac{1}{2}"$ to $\frac{3}{4}"\times 4"$, depending on the KVA (Kilo-Volt-Ampere) rating of the transformer.

The need to connect and disconnect, for example, the Biddle TT ratiometer primary leads and to clamp and unclamp the secondary connectors three times to perform turns ratio measurements on a common core three phase transformer or on three single phase transformers connected in a delta-star configuration, indicated that a need existed for a device which would permit the three required turns ratio measurements to be made quickly and without the need for making separate connections to the seven transformer terminals.

SUMMARY OF THE INVENTION

Accordingly, it is an object of this invention to provide an improved test fixture for testing transformer turns ratios.

It is another object of this invention to provide a test fixture which facilitates transformer turns ratio (TTR) measurements through the usage of seven test leads which extend the reach of the Biddle TTR unit from 6 feet to 12 feet (or more if required in connection with the transformer measuring schedule).

It is still another object of this invention to provide a test fixture which connects the four input terminals of the Biddle TTR unit to a correct selection of the seven extended test leads to the transformer being ratio tested.

It is a further object of this invention to provide a test fixture which incorporates a switching means which permits the three primary and three secondary windings of the transformer under test to be sequentially connected to the Biddle TTR unit.

It is a still further object of this invention to provide a test fixture having two switchbox output terminals which permit the dual secondary current and potential leads from the Biddle TTR unit with specially designed "C" clamps to be properly connected.

It is still another object of this invention to provide a test fixture which incorporates the switching arrangement for transformer winding selection in a metal cabinet.

It is another object of this invention to provide a test fixture having sufficient space in one end of the metal cabinet for storage of the three primary and four secondary transformer test leads when the fixture is transported from job to job.

It is still another object of this invention to provide a test fixture which has the switches and terminals on the transformer testing fixture labeled to conform with NEMA standards for three phase transformer terminal designations.

The foregoing, and other objects, features and advantages of the invention will be apparent from the following, more particular description of the preferred embodiment of the invention, as illustrated in the accompanying drawing.

DETAILED DESCRIPTION OF THE SPECIFICATION

Figure 1:
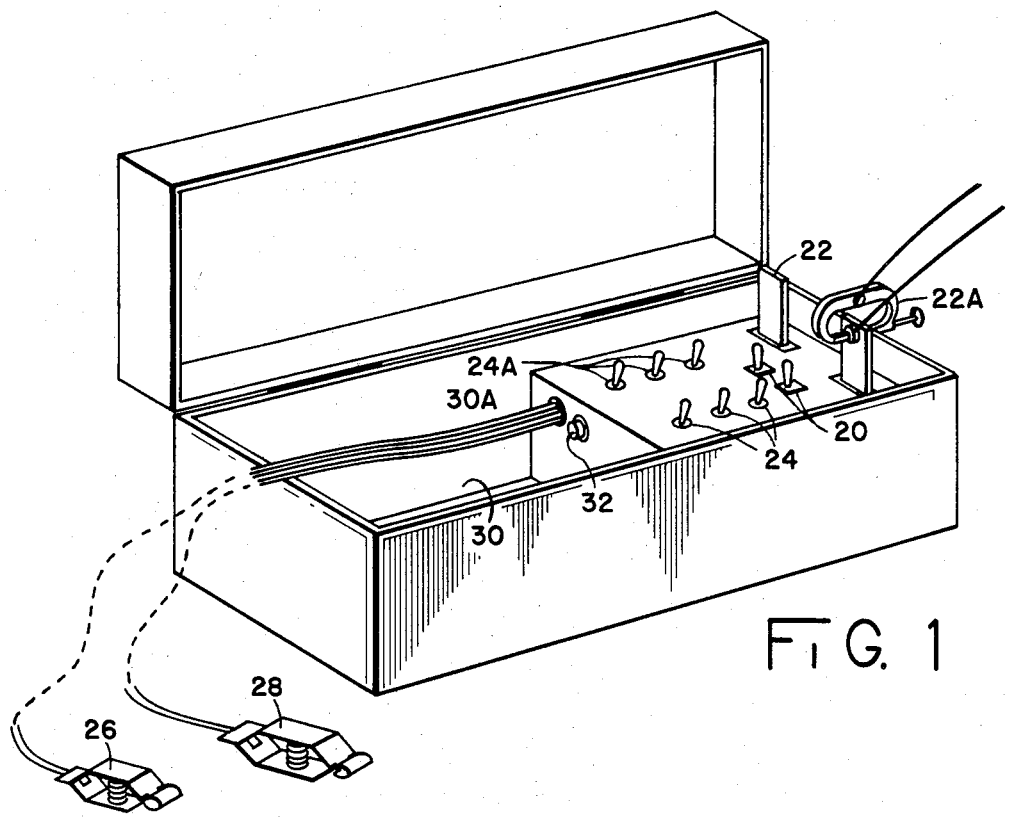
FIG. 1 is a perspective view of the test fixture of this invention showing an open metal cabinet housing the switching matrix and transformer connecting leads with test clip terminations.

FIG. 1 shows the test fixture with its switching panel or means, housing and cables. Transformer connection leads with test clips 26 and 28 and winding selection switches 24 and 24A are assembled in preferably a metal box having, for example, the dimensions 8"×8"×19". The carrying box or case for the test fixture may be a commercially available housing of ferrous sheet metal or a custom built housing of aluminum or other material (wood or plastic) of the same approximate dimensions. The primary (two) terminals for connection to the primary test clips to the Biddle TTR unit are shown at 20 of FIGS. 1 and 1A. The primary terminals 20 are preferably plain or threaded 3/16" brass pillars mounted on insulating pads for the purpose of accommodating the primary test clips of the Biddle TTR unit (not shown).

Figure 1A:
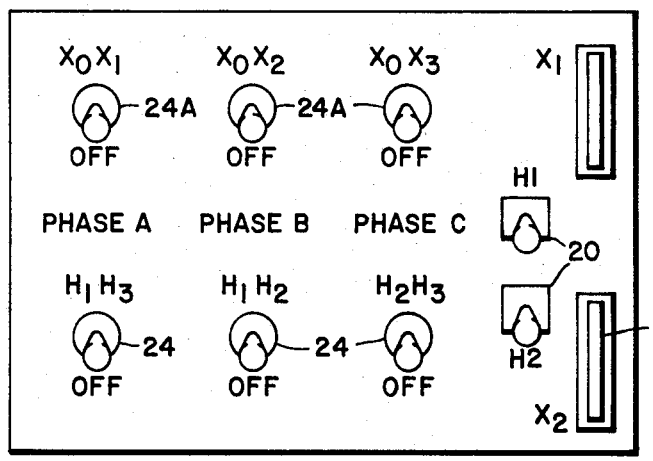
FIG. 1A is a side elevational view of the test fixture's switch panel of FIG. 1 showing layout and identification marking of the winding selection switches, the primary terminals for connection to the Biddle TTR unit and the special dual contact secondary terminals designed to accommodate the "C" clamp secondary connections to the TTR units.
Figure 1B:
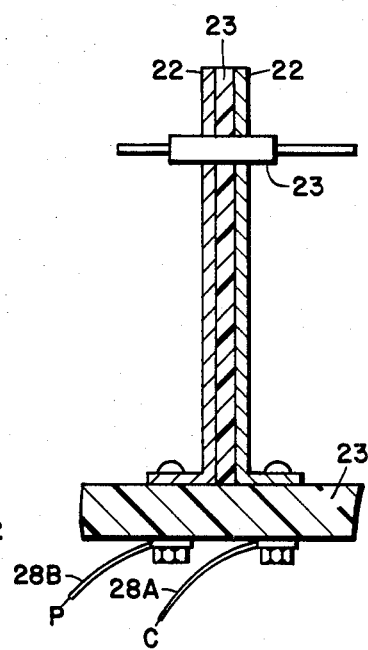
FIG. 1B shows a cross-sectional side elevational view of one of the dual contact secondary terminals shown in the switch panel of FIG. 1A.

Specially designed terminals for accommodation of the "C" clamp two wire connectors to the Biddle TTR unit are shown at 22, FIGS. 1, 1A and 1B. The Biddle "C" clamp secondary input connector is shown at 22A (which is shown solely for illustrative purposes).

Figure 2:
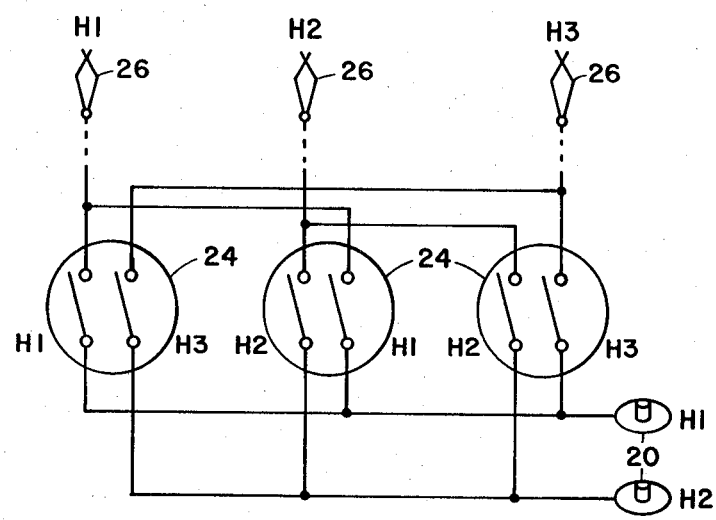
FIG. 2 is a wiring diagram of the schematic details of the three switches $H_1H_3$, $H_1H_2$, $H_2H_3$ of the switch panel of FIG. 1A showing primary lead connections to three double pole single throw switches, which permit conbinations of primary leads from the transformer to be connected to the primary terminals connected to the Biddle TTR unit.

The three double pole, on-off switches for primary winding combinations are shown at 24 in FIGS. 1, 1A and 2. Three four pole on-off switches for secondary winding combinations are shown at 24A, FIGS. 1, 1A and 2A. The three test clips terminating the three primary test leads are shown at 26 in FIG. 2 (only one of which is shown in FIG. 1). The primary test clip 26 (3 required for $H_1$, $H_2$, $H_3$ see FIG. 2) should be similar or equal to the Mueller type 48C, 20 amp general purpose spring clip. The primary test leads connected to the primary test clips 26 for primary transformer connections should be similar or equal to Alpha 5857 type E, 19×30 AWG, 600 volt Teflon (color selection to meet user lead identification requirements).

Figure 2A:
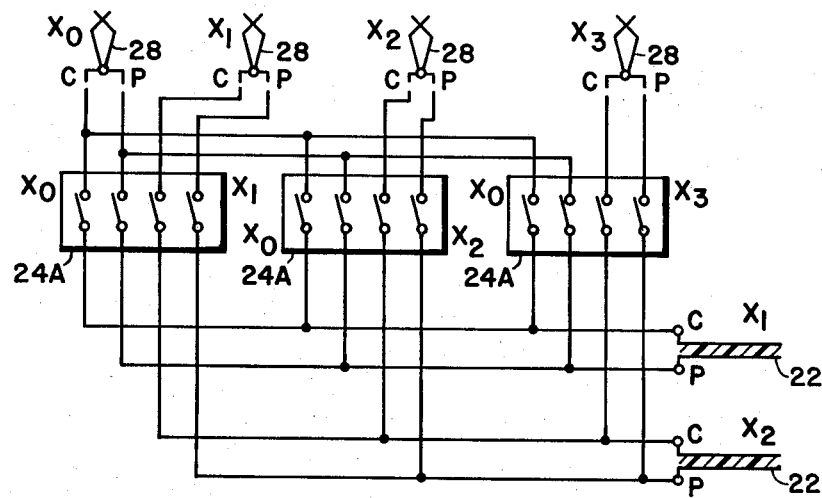
FIG. 2A is a wiring diagram of the schematic details of the three switches $X_0X_1$, $X_0X_2$, $X_0X_3$ of the switch panel of FIG. 1A showing secondary lead connections to three four pole single throw switches which permit combinations of secondary leads from the transformer to be connected to the Biddle TTR unit.
Figure 2B:
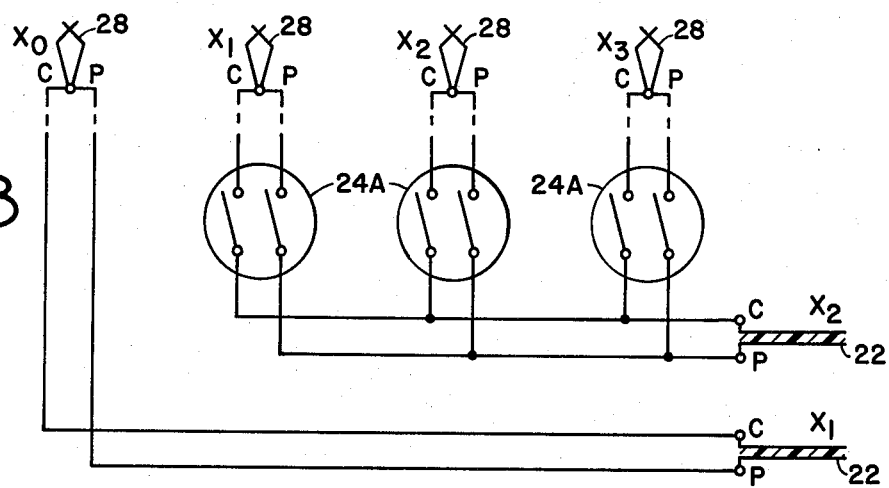
FIG. 2B is a wiring diagram of an alternate embodiment of the invention using three double pole single throw switches showing an unswitched straight through connection of a star center terminal ($X_0$) which is common to all other star secondaries ($X_1X_2X_3$).

Test lead termination for secondary transformer connections is shown at 28 in FIGS. 1, 2A and 2B (only one shown in FIG. 1, but four are used as shown in FIGS. 2A and 2B). The test clip shown by reference numeral 28 should be similar or equal to the Mueller type 25C, 75 amp, general purpose clip. Dual test leads are used for each transformer secondary connection. A single current and a single potential wire is terminated by parallel connection at each of the test clips 28. The four current and the four potential wires which comprise the secondary connection leads are carried through the switching matrix or panel without contacting each other. One of the current wires terminate as shown in FIG. 1B at 28A of terminal 22 and one of the potential wires are connected to terminal 22 at 28B. There are two terminal 22 elements (see $X_1$ and $X_2$ of FIG. 1A). The other two of the four current wires and the other two of the four potential wires terminate in the switch arrangement as described below. The current wire attached to secondary clip 28 should be similar or equal to Alpha 5859 type E, 19×25 AWG. 600 volt Teflon. The potential wire attached to the secondary clip 28 should be similar or equal to Alpha 5857. The current and potential wires which make up the secondary test leads can be paired with spaced bands of heat shrink tubing or plastic tape. Color combinations should be in accordance with user requirements for lead identification. Space reserved in the carrying case for storage of test leads when the test accessory is not in use or during transport, is shown at 30 in FIG. 1. The grommet where test leads enter the switch test fixture or box is shown at 30A of FIG. 1. Shown at 32 in FIG. 1 is a binding post terminal for grounding the test fixture. For field or shop operation, a wire from 32 should be connected to the ground terminal on the Biddle TTR unit and also to a convenient external grounding point.

Measurement of transformer primary to secondary turns ratio involves comparison of a variable ratio standard transformer with the transformer under test. Thus, in this test the absolute values of current or voltage are, within limits, not critical, so that lead resistance or lead lengths is not a factor affecting accuracy. A primary and secondary lead length of 12 feet has been mentioned above as preferred, but this footage can be adjusted to conform with the bulk of requirements which will be encountered in the field or shop where the TTR unit and the test fixture will be used.

Switches and terminal layout of the test panel is shown in FIG. 1A. Terminals shown at 20 and 22 are to permit connection to the Biddle TTR unit. Primary switches 24 in FIG. 1A marked $H_1H_3$, $H_1H_2$, and $H_2H_3$ should be similar or equal to Cutler-Hammer Switch Type 7320K2 or 7560K6, On-Off, 15/16 amp 125 volt. Secondary switches 24A in FIG. 1A marked $X_0X_1$, $X_0X_2$ and $X_0X_3$ should be similar or equal to Cutler-Hammer Switch Type 7690K8 On-Off, 15 amp 125 volt. If the alternate embodiment for the secondary switch wiring shown in FIG. 2B is used, the same switches for primary and secondary switching can be used i.e. Cutler-Hammer Type 7320K2 or 7560K6. FIG. 1B shows construction details of one of the two special dual terminals designed to accommodate the Biddle "C" clamp connector. For example, two vertical No. 18 copper blades approximately 1¼" by 3" are bolted to an insulating mounting and separated by an insulating spacer 23 of formica or a similar insulator. The blades are insulated from the switch panel by a fiber insulating grommet 23. The double terminal assemblies are preferably rigidly affixed to the switch panel at a height through the panel sufficient to accommodate the Biddle "C" clamps. The secondary current wires 28A from the winding selection switches (see FIGS. 1B 2A and 2B) are attached to the terminal blades next to the outside wall of the carrying case. The inner blades are connected to the potential wires. In use, the "C" clamps are always attached to the terminals with the wing screws facing outward.

Operation

The wiring diagram of FIG. 2 shows that closure of any one of the double pole switches 24 ($H_1H_3$ or $H_2H_1$ or $H_2H_3$) will place one of the delta connected transformer primary windings (not shown, but connected to the terminal clips 26) across terminals 20 ($H_1$, $H_2$) connected to the Biddle TTR unit. Operation or closure of any two switches 24 simultaneously will short circuit one winding of the transformer delta. The circuit output terminals 20 are short circuited in the case of parallel closure of switches $H_1H_3$ and $H_2H_3$. The wiring diagrams in FIGS. 2A and 2B show that operation of any one of the switches designated 24A will connect one transformer secondary winding to Biddle TTR unit input terminals $X_1$ and $X_2$ through the segregated current and potential leads. Due to the differences in the star or "Y" configuration and the delta connection, simultaneous operation of two or even three of switches 24A will only parallel the three secondaries without shorting either $X_1$ or $X_2$ or any winding. The adverse phase relationship between windings would make such a parallel connection tantamount to a short circuit, so operation of two selector switches simultaneously is not called for in the test fixture measurement schedule.

When the Biddle TTR unit test leads are connected to $H_1$ and $H_2$ and to $X_1$ and $X_2$ of the test fixture and if the transformer under test is at a service location, removal of the transformer primary links of the transformer under test should be verified. Even with a nearby secondary isolation switch, it is probably desirable to disconnect the four X leads ($X_0$, $X_1$, $X_2$, $X_3$) of FIGS. 2A or 2B to avoid accidental secondary reconnection. After the extension test leads are connected to the correct transformer terminals, the six switchbox switches should be turned off. The Biddle TTR ratio switches and vernier dial (not shown) should be set to 00.000 and the magneto cranked to check the null balance of the unit. With the tap changer used on utility transformers for small voltage increments in the normal position (neither "up" or "down") one calculates the transformer ratio (as shown by the name plate data and sets the TTR unit ratio switch accordingly. The primary switches $H_1H_3$ and $X_0X_1$ are turned on and one measures the ratio of the A phase windings. This should conform within a few percentage points to the calculated ratio. The measurements for phase B and C are repeated. The tap changer is run up and down with the operator measuring and recording the transformer turn ratios on each tap. If it should not be possible to get a null on any phase or if one reading is out of tolerance, the switch fixture or box is disconnected and the Biddle TTR unit is connected directly to the primary and secondary windings in question, to verify the possibility of a shorted turn.

Brief Summary of the Specification

Thus, as described above with reference to the figures, the use of switching means with test lead extensions makes it possible to measure the ratios of three single phase transformers or the internal elements of a delta-star connected utility transformer with a commercially available TTR unit, without the need for rearrangement or reconnection of test leads during measurement. This results in a considerable saving of time and expense and in a reduction of measurement effort.

In field work, a transformer undergoing tests may be only one of several other transformers on a platform or on a substation pad which may or may not be energized and represent a safety hazard to the operator making tests on the isolated transformer. The availability of test lead extensions and a reduction in the number of test lead attachments to the isolated transformer are considered a worthwhile safety feature.

While the invention has been particularly shown and described in reference to the preferred embodiment thereof, it will be understood by those skilled in the art that changes in the form and details may be made therein without departing from the spirit and scope of the invention.

What is claimed:

1. In a system comprising a transformer turns ratio test unit and a transformer having both primary and secondary windings to be ratio tested which system utilizes said transformer turns ratio test unit to perform turns ratio tests on said transformer to be tested, a test fixture comprising: input coupling means for connection to a transformer to be tested, output coupling means for connection to a turns ratio test unit, switching means connected between said input and output coupling means, said input means comprising seven test leads comprising three wire primary transformer connection leads, and four double wire secondary transformer connection leads, each of said four double wire secondary transformer connection leads having a current wire and a potential wire, said output coupling means comprising a pair of secondary output terminals for connection to the secondary test leads of said turns ratio test unit, said output coupling means further comprising a pair of primary output terminals for connection to the primary test leads of said turns ratio test unit.

said switching means further comprising three primary switching element means and three secondary switching element means, said primary switching elment means effecting the selective electrical coupling of any two of three primary transformer connection leads to said primary output terminals.

said secondary switching element means effecting the selective electrical coupling of a common one of four of said secondary transformer connection leads and one of the other three secondary transformer connection leads to said pair of secondary output terminals.

2. A test fixture in accordance to claim 1 wherein said secondary output terminals are elongated electrodes having a dielectric spacer located between said electrodes.

3. A test fixture in accordance to claim 1 wherein said input coupling test lead connection means are clips.

4. A test fixture in accordance to claim 1 wherein the three primary switching element means comprise three seperate double pole on-off switches, and the three secondary switching element means comprising three seperate four pole on-off switches.

* * * * *